United States Patent [19]

Hennig

[11] Patent Number: 4,862,082
[45] Date of Patent: Aug. 29, 1989

[54] METHOD FOR ENCODING AND DISPLAYING N PARAMETERS IN MULTI-DIMENSIONAL FOURIER NMR SPECTROSCOPY

[75] Inventor: Jurgen Hennig, Freiburg, Fed. Rep. of Germany

[73] Assignee: Spectrospin AG, Fallanden/Zurich, Switzerland

[21] Appl. No.: 232,391

[22] Filed: Aug. 12, 1988

[30] Foreign Application Priority Data

Aug. 13, 1987 [DE] Fed. Rep. of Germany ....... 3726932

[51] Int. Cl.$^4$ .............................................. G01B 33/20
[52] U.S. Cl. ..................................... 324/309; 324/312
[58] Field of Search ............... 324/300, 307, 308, 309, 324/312, 314; 128/653

[56] References Cited

U.S. PATENT DOCUMENTS

| | | | |
|---|---|---|---|
| 4,521,733 | 6/1985 | Bottomley | 324/309 |
| 4,678,996 | 7/1987 | Haacke | 324/309 |
| 4,752,734 | 6/1988 | Wedeen | 324/309 |
| 4,777,957 | 10/1988 | Wehrli | 324/309 |
| 4,796,635 | 1/1989 | Dumoulin | 324/309 |
| 4,800,889 | 1/1989 | Dumoulin | 324/309 |

FOREIGN PATENT DOCUMENTS 3528894 3/1986 Fed. Rep. of Germany .
3445689 6/1986 Fed. Rep. of Germany .
2173001 10/1986 United Kingdom .

Primary Examiner—Michael J. Tokar
Attorney, Agent, or Firm—Pennie & Edmonds

[57] ABSTRACT

Method for encoding n parameters in multi-dimensional Fourier NMR spectroscopy. In NMR tomography, recording a third parameter is rendered possible without any additional input, in addition to the determination of the two-dimensional data required for generating an image, by generating phase-encoded double signals. During Fourier transformation the double signals lead to a striated pattern which is characteristic of the amount of the paramter. It is possible in this manner to represent in NMR images in particular the velocity of a flowing material or, for example, variations of the static magentic field, the susceptibility and the chemical displacement.

15 Claims, 7 Drawing Sheets

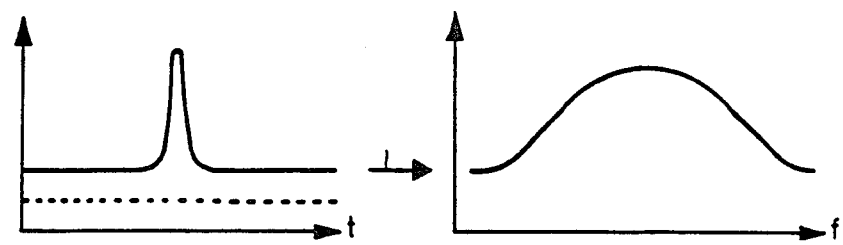
Fig. 1a  Fig. 1b
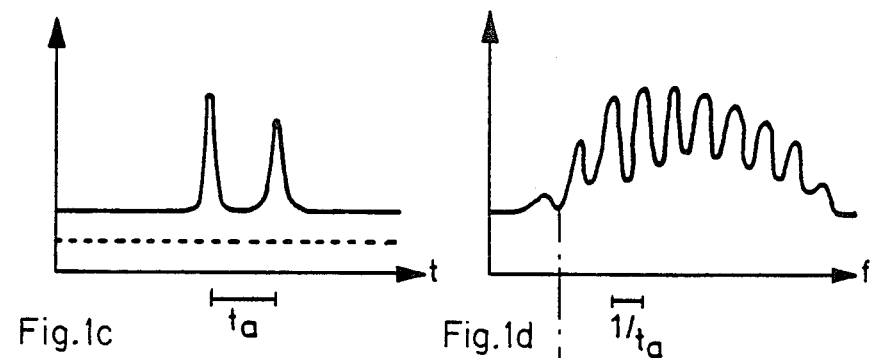
Fig. 1c  $t_a$  Fig. 1d  $1/t_a$
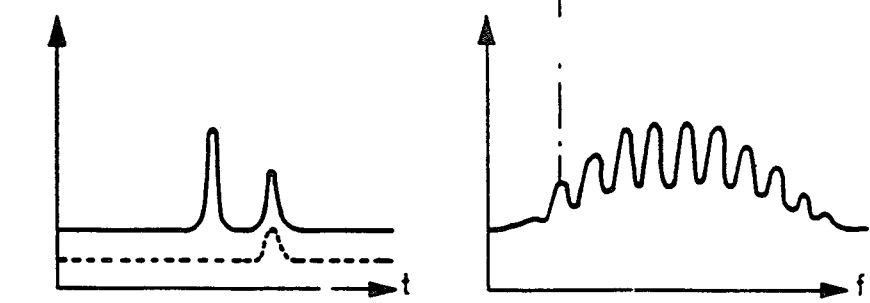
Fig. 1e  Fig. 1f

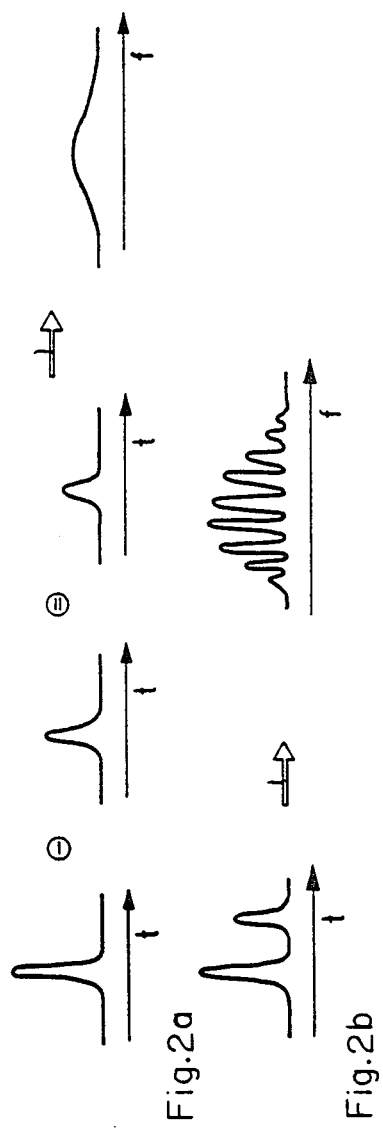
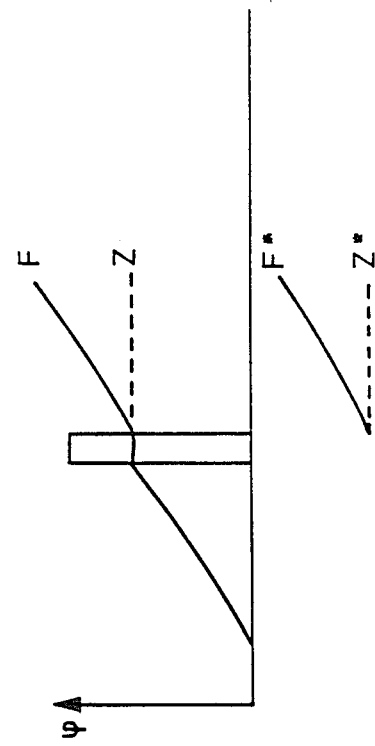
Fig.2a
Fig.2b
Fig.4

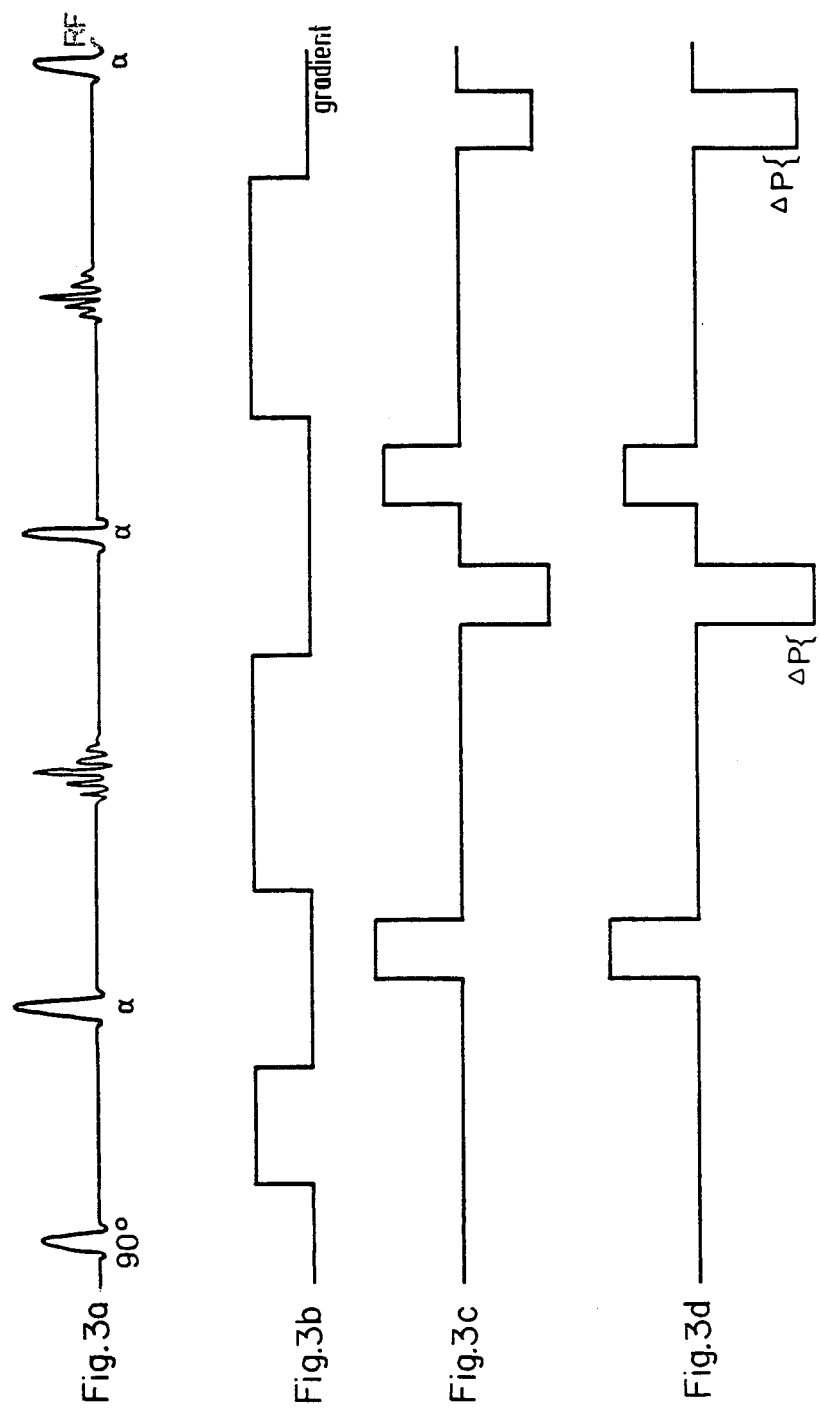

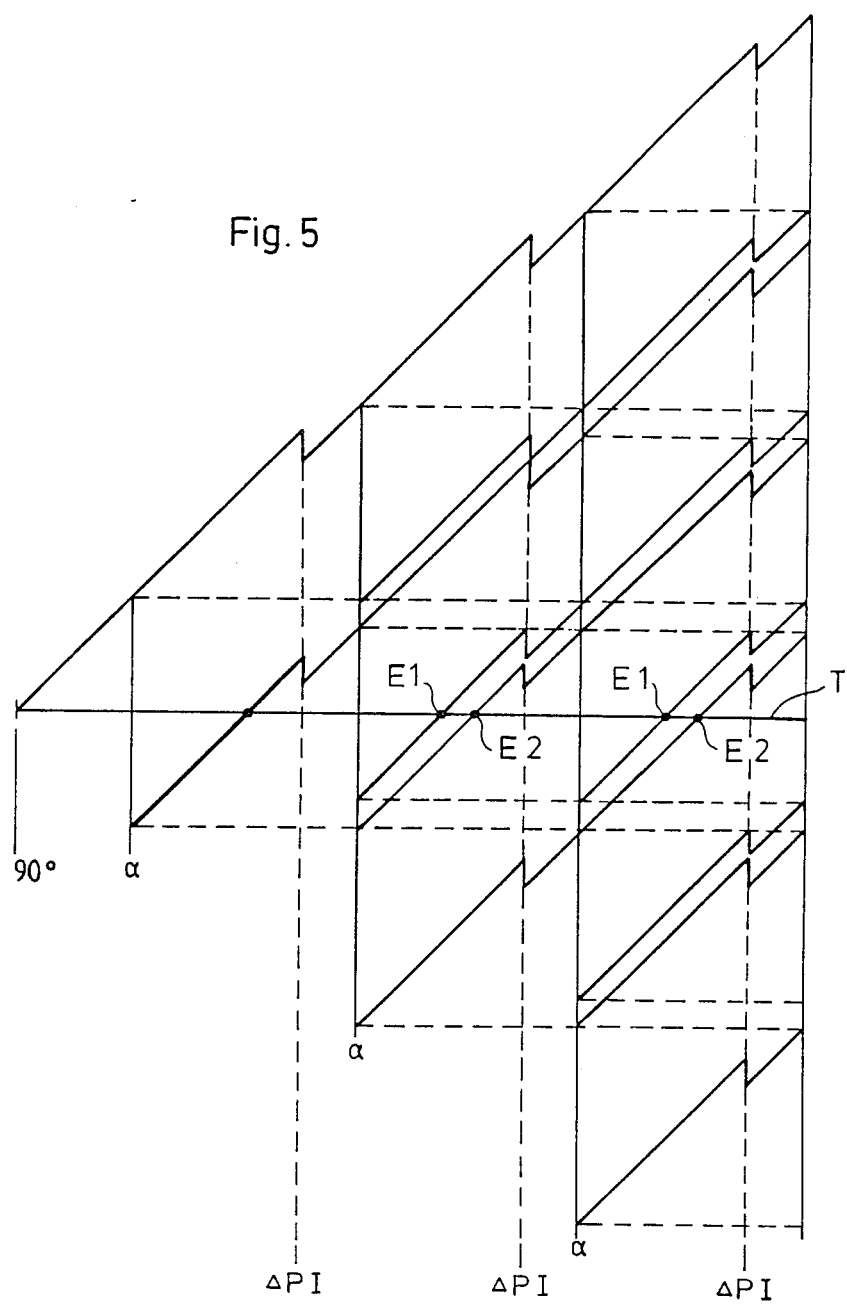

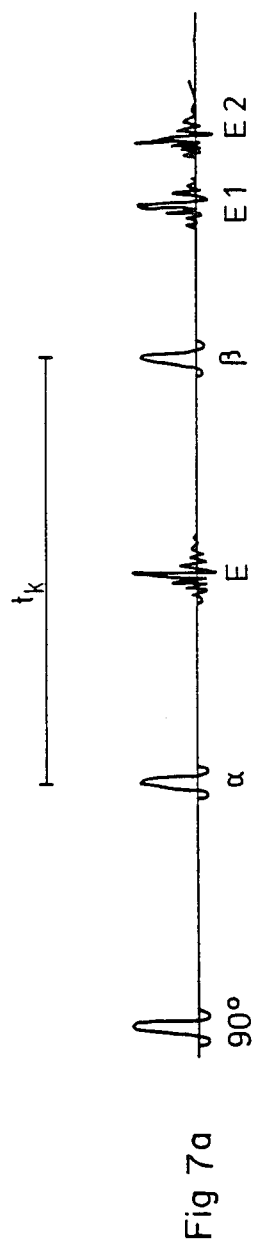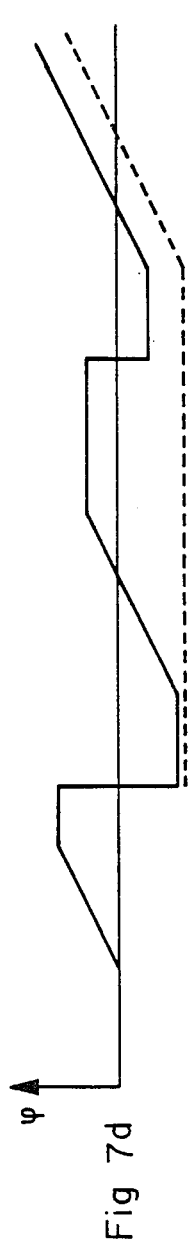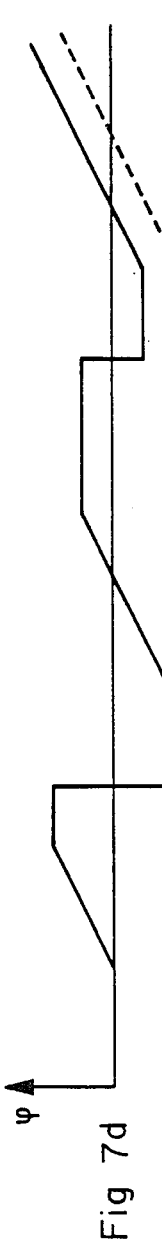
Fig 7a
Fig 7b
Fig 7c
Fig 7d

METHOD FOR ENCODING AND DISPLAYING N PARAMETERS IN MULTI-DIMENSIONAL FOURIER NMR SPECTROSCOPY

The present invention relates to a method having the characteristics outlined in the preamble of claim 1.

A method of this type has been known already from DE No. 34 45 689 A1. This known method makes use of pulse sequences furnishing successively a direct spin echo signal and a stimulated spin echo signal. These signals, which correspond to two data sets, are separately subjected to Fourier transformation so that they furnish different images the comparison of which enables conclusions to be drawn regarding the encoded parameter, for example the velocity of a substance. By determining the difference between the data obtained by such Fourier transformation, direct flux and flow representations can be obtained also in the form of differential images.

A similar method for measuring the flow velocity of liquids has been described also by Magnetic Resonance in Medicine, Vol. 1985, pages 555 to 566. From the Journal of Magnetic Resonance, Vol 70, 1986, pages 163 to 168, a method has been known for determining variations of the magnetic susceptibility by varying the phase of successive signals, while GB 21 73 001 A describes a method of measuring the distribution of the primary magnetic field.

All these methods have in common that the successive first and second signals belong to two different data sets and that the value of the parameter to be determined is obtained by linear combination of the two data sets. For the purpose of such linear combination it is necessary either to record two independent signal sets which are then subtracted whereafter the differential signal is subjected to Fourier transformation, or else to derive the data signals first by Fourier transformation and subtract them thereafter. However, the described linear combination leads to correct results only if the signals of the two data sets are produced with high reproducibility. It is particularly significant in this connection that the amplitude of the two signals is of decisive importance. Even slight amplitude variations may result in considerable adulteration of the parameter to be measured.

From DE No. 35 28 894 A1 it has also been known to produce two data sets which are encoded by a phase information corresponding to two different velocity profiles of a fluid which have been picked up at different points in time. For the purposes of Fourier transformation, the calculations are carried out using a set of signals covering a time interval whose center in time is displaced a short way relative to the center of the spin echo signal. Due to this displacement, the image date are multiplied by a phase factor with the result that the image generated exhibits a striated pattern which is determined by the phase encoding by the nth parameter. However, it is easily seen that the accuracy of this method is dependent, to a high degree., on the accuracy of the displacement of the center of the time interval relative to the center of the spin echo signal.

Now, it is the object of the present invention to improve a method of the type described above so as to enable the nth parameter to be determined and represented with high accuracy, without any particular requirements regarding the reproducibility of the method, or any special signal processing measures.

This object is achieved with the aid of the features set forth in the characterizing part of claim 1.

In the case of the method according to the invention, therefore, no linear combination of the signals corresponding to the (n−1) data sets is effected, and no more or less manipulation of the successive pairs of first and second signals is effected, either. Instead, these signals are simply treated as uniform signals and subjected to Fourier transformation so that one obtains automatically a striated pattern which is characteristic of the nth parameter.

Compared with the usual methods of n-dimensional Fourier NMR spectroscopy, the number of measuring sequences is reduced to the number required for plotting a spectrum of the next lower dimension. As a result, the recording time is reduced accordingly. The signals which are shifted in phase relative to each other occur during the same measuring sequences so that the reproducibility of the signals obtained during the individual measuring sequences is of no particular importance. If any changes should occur in the measuring set-up or the condition of the object to be measured while the spectra are being plotted, this has no particular influence on the determination of the nth dimension. In addition, the striated pattern is obtained without any additional computations and can be easily interpreted. Further, one has the possibility, by appropriate selection of the parameters of the measuring sequences, to adjust the intensity of the striated pattern to a value which ensures both, good discernibility of the striated pattern and perfect interpretation of the image.

It is an essential aspect of the invention that during each measuring sequence required for plotting the (n−1) dimensional spectrum two signals are furnished which correspond to the one and the other of the two data sets, respectively, and which are shifted in phase relative to each other in the direction of evolution of the nth parameter.

The two signals can be obtained in different ways. For example, the (n−1) data sets can be recorded using pulse sequences which provide a direct and a stimulated echo as first and second signals, respectively. The intensity of the striated pattern obtained according to the invention may be influenced in this case by the value of the flip angles. In particular, the flip angle of the first refocussing pulse may differ from the flip angle of the following refocussing pulses.

According to a preferred embodiment of the invention, the measuring sequences consist of pulse sequences which comprise a number of successive refocussing pulses and where at least one of the parameters is encoded by a field gradient which is assigned a compensation gradient following each echo signal. In the case of the methods that have been usual heretofore, the compensation gradient is inversely equal to the field gradient to effect complete rephasing. In the case of the method according to the invention, however, the nth parameter is encoded by the generation of a compensation gradient different from the field gradient.

When pulse sequences furnishing a direct and a stimulated echo are used it is, however, also possible to encode the nth parameter during the time interval between the first and the second refocussing pulse when the magnetization of the content generating the stimulated signal is a coherent z magnetization so that this encoding has an influence only on the phase position of the direct echo.

According to another possibility, the (n−1) data sets are recorded with the aid of pulse sequences furnish as signals the free induction decay and an echo signal, the former corresponding to the one and the latter corresponding to the other of the two data sets. In this case, encoding of the nth parameter is effected during the time interval which precedes the refocussing pulse effecting the generation of the echo signal and during which only the content furnishing the echo signal is recorded.

In the cases described last, encoding of the nth parameter can again be effected by applying a corresponding gradient during the before-mentioned time interval.

As mentioned before, the method according to the invention is of particular significance for determining a parameter representative of certain properties of a substance in an imaging process where the n−1=2 parameters are characteristic of two directions in the image plane and the third parameter, which is characteristic of a property of the substance, is displayed in the form of a striated pattern which is superposed upon the image. For example, the nth parameter and, accordingly, the third parameter of the display may represent the velocity of the substance under examination or else the variation of its local susceptibility. The properties of the substance may, however, also reflect the environment to which the substance under examination is exposed, in which case the nth parameter may, for example, also relate to the variation of the strength of the local magnetic field or the variation of the chemical displacement in the area of the substance under examination.

The invention will now be described and explained in greater detail with reference to the embodiments shown in the drawing. The features that can be derived from the following description and the drawing may be used in other embodiments of the invention either individually or in any desired combination. In the drawing:

FIGS. 1a through 1f are diagrams illustrating the principle underlying the present invention;

FIGS. 2a and 2b are diagrams illustrating the difference between the conventional linear combination and the method according to the invention;

FIGS. 3a through 3d depict the diagram of a pulse sequence of the type used in one embodiment of the invention, compared with a pulse sequence for a conventional imaging method;

FIG. 4 shows a diagram illustrating the evolution in time of the ρ phase of the transverse magnetization during application of the gradient field and under the effect of an rf pulse:

FIG. 5 shows a diagram of the phase evolution during application of the pulse sequence illustrated in FIGS. 3a through 3d;

FIGS. 7a through 7d depict the diagram of the pulse sequence used by another embodiment of the invention;

Figure 9:
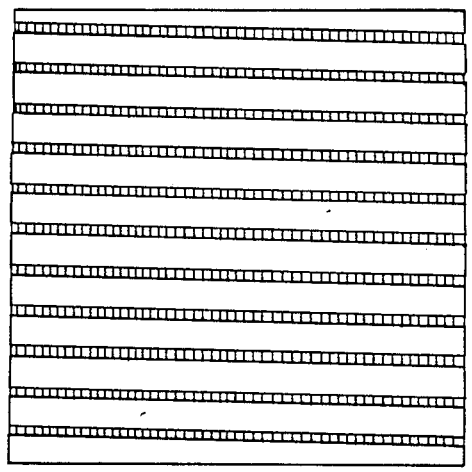
FIG. 9 shows the spectrogram of a vessel containing still water, obtained by the method according to the invention.
Figure 10:
FIG. 10 shows the spectrogram of a hose passed by flowing water, obtained by the method according to the invention.

The invention will now be described with reference to its most important application, namely the generation of two-dimensional images which is the basis of NMR tomography. The result obtained by the method according to the invention consists in an NMR image with a striated pattern projected thereupon. The parameter to be measured is represented by variations in the striated pattern which do not materially affect the information provided by the image. FIG. 9 shows the image of a square vessel containing still water, with superposed horizontal bands. In contrast, FIG. 10 shows the image of a hose through which is passed flowing water, with superposed parabolic bands which provide a quantitatively correct image of the flow conditions prevailing in the hose It is understood that numerous other experiments are possible, in addition to flow measurements, by which other parameters, for example the chemical displacement, the magnetic susceptibility, field inhomogeneities, etc., can be rendered visible in the form of variations of the projected striated pattern. A striated pattern can be projected upon a given image by generation of interference. FIG. 1a shows a signal in the time domain, FIG. 1b its Fourier transform in the frequency domain. If the signal represented in FIG. 1a occurs again, displaced in the time domain, as illustrated in FIG. 1c, Fourier transformation of the double signal will - according to the displacement theorem of Fourier transformation - lead to the lineshape illustrated in FIG. 1d which represents the transform of the simple signal and the function exp $(-i2\pi ft_a)$, wherein f is the frequency of the Fourier transform and $t_a$ is the spacing between the two signals in the time domain. The image representation of the Fourier transform leads to a striated pattern of the type shown in FIGS. 9 and 10. It should be noted that due to the reciprocal properties of Fourier transformation, narrow signal spacings in the time domain result in big spacings of the bands, and vice versa.

When applying the displacement theorem the opposite way, it follows that the displacement of the striated pattern as shown in FIG. 1f, with reference to the striated pattern according to FIG. 1d, occurs when the signal in time domain is multiplied by the function exp $(-i2\pi ft_a)$, which in fact means nothing else than that a phase difference is produced between the two time signals according to FIGS. 1c and 1e.

From the above it follows for NMR spectroscopy that every method used for generating an image by which a double signal is produced which comprises two individual signals shifted in phase relative to each other will result in an image comprising the image normally obtained when the signal is not doubled, and a superposed striated pattern which appears to be geometrically displaced as a function of the parameter effecting the phase variation. Considering that phase variations occurring in response to some parameter are the basis of FT spectroscopy generally, it follows necessarily that every parameter which can be measured by means of any FT spectroscopy method is capable also of being displayed in the form of a striated pattern generated by the method according to the invention. Given the fact that the method according to the invention consists essentially of the generation of interference bands representing the relative phase position of signals corresponding to each other, the method according to the invention may also be described as NMR interferometry. It should be noted in this connection in particular that doubling of the signal can be effected not only along the time axis, i.e. in the direction of the read gradient of the image, but also along the second coordinate, for example in the direction of the gradient serving for phase encoding. It will be readily seen that the method according to the invention is applicable not only for recording a third parameter in images plotted by NMR spectroscopy, but may be used also, without any notable additional input, for recording an additional parameter in any multi-dimensional method of FT spectroscopy.

Given the fact that the method according to the invention uses two signals which are modified in response to a parameter—just as in the method described above where a linear combination is produced from two data sets—it would seem appropriate to point out the fundamental differences between the two methods. While for producing a linear combination of the type represented in FIG. 2 two mutually independent signal sets must be recorded and subtracted from each other, before the differential signal can be subjected to Fourier transformation, the two signals to be combined are obtained in the case of the method according to the invention by recording a single signal set which is then subjected to Fourier transformation without any additional operations, as represented once more in FIG. 2b. Compared with the known method represented in FIG. 2a, this reduces the recording time to half the time needed for the conventional method, and in addition no particular demands regarding the reproducibility have to be met in the case of the method according to the invention. It is of particular significance in this connection that the amplitude of the two signals is almost of no importance. A weak second signal only leads to reduced intensity of the striated pattern but has no influence on the displacement of the band which is determined by the parameter and, thus, on the quantitative determination of the parameter. In many cases it will even be useful to reduce the intensity of the striated pattern, which is superposed upon the image, in order to preserve the full information content of the image. In the case of the conventional linear combination, in contrast, every modulation of the amplitude will lead to drastical errors in the determination of the parameter.

Considering that in the case of NMR interferometry according to the invention the two signals are picked up during an acquisition time which is in the range of only 10 to 20 ms for NMR image recording, any effects resulting the measuring set-up or the measured object that may lead to measuring errors are practically excluded since any changes in the measuring conditions must necessarily be very small during such a short acquisition time. In addition, the method according to the invention is the only one to provide the possibility to determine any parameter variations in a direction other than the direction of the time axis.

It is true that an NMR interferogram may be produced also by computational processing of the signal sets obtained by successive measurements; however, in this case the rapidity and the low susceptibility to errors are lost which exactly make up the advantage of the method according to the invention. Particularly clear results are furnished by NMR interferometry according to the invention in all cases where the parameter to be determined effects linear phase variations and, accordingly, linear displacements of the striated pattern. If the phase variation is more complex, the clearness of the results obtained is diminished. Accordingly, NMR interferometry according to the invention is particularly well suited for measuring all those variables which can be characterized by a single parameter, such as the field homogeneity, the susceptibility, velocity, diffusion, fat/water separation and the like. Mult-parameter variables of the type encountered in spectroscopy cannot be recorded as efficiently.

The principles of the invention having now been explained, some special embodiments of the method according to the invention will be described hereafter in greater detail.

The method illustrated in FIG. 3 is particularly well suited for determining the velocity of flowing material with high sensitivity. The method can be carried out in an NMR imaging spectrometer of the type generally used for NMR tomography. The method is based on the pulse sequence illustrated in FIG. 3a where an approximately 90° pulse is followed by a number of rf pulses having a flip angle $\alpha$ different from 180°. Preferably, the flip angle $\alpha$ is in the range of from 120° to about 150°. A flip angle of about 135° is particularly preferred. The time interval between adjacent $\alpha$ pulses is equal to approximately twice the time interval between the first $\alpha$ pulse and the initial 90° pulse. In general, the time interval between adjacent $\alpha$ pulses is ordinarily limited by the magnetic-field-gradient switching behavior of the NMR imaging spectrometer. The time interval between adjacent $\alpha$ pulses is preferably in the range of from about 20 to about 35 msec, with a time interval of about 30 msec being particularly preferred. At least one read is inserted in each time interval between the rf pulses (FIG. 3b). In general, the strength of the magnetic field gradients is determined by the criteria for the NMR imaging procedure employed. For example, a read gradient of roughly 3mT/m—which provides an acquisition bandwidth of roughly 25 kHz—is satisfactory for many applications. The pulse sequence is a spin echo pulse sequence where echo signals occur between the $\alpha$ pulses. For imaging purposes, a phase gradient represented in FIG. 3c is inserted in the usual manner, in addition to the disk-selection measures not shown in detail. In the case of the conventional methods, for example the known RARE methods, the phase gradient is inserted twice, with opposite signs, between two $\alpha$ pulses, namely before and after the echo signal, in order to achieve rephasing of the excited spins which is necessary for the generation of the echo signals. The known RARE method, as represented in lines (a) to (c) of FIG. 3, makes it possible, in the extreme case, to produce all projections required for image reconstruction by a single excitation of the spin system.

The method according to the invention differs from the known RARE experiment insofar as the rf pulses following the approximately 90° excitation pulse are not 180° pulses, but produce a flip angle different from 180°, as mentioned before. In addition, the compensation of the phase gradient is varied after the echo signal has been received. In the simplest of all cases, this is effected by compensation with a phase gradient differing from the inversely equal phase gradient by a constant amount, as represented in FIG. 3d, instead of effecting the compensation with an inversely equal phase gradient as represented in FIG. 3c.

As has been explained in greater detail by the publication mentioned at the outset, refocussing by means of an rf pulse having a flip angle $\alpha$ of less than 180° will lead to the transverse magnetization being split up into 4 sub-states which are illustrated diagrammatically in the phase diagram of FIG. 4. As is obvious from FIG. 4, a portion F of the phase $\phi$ of the transverse magnetization develops undisturbed, while another portion F* is inverted. The two remaining portions Z and Z* carry coherent z magnetization.

Figure 6:
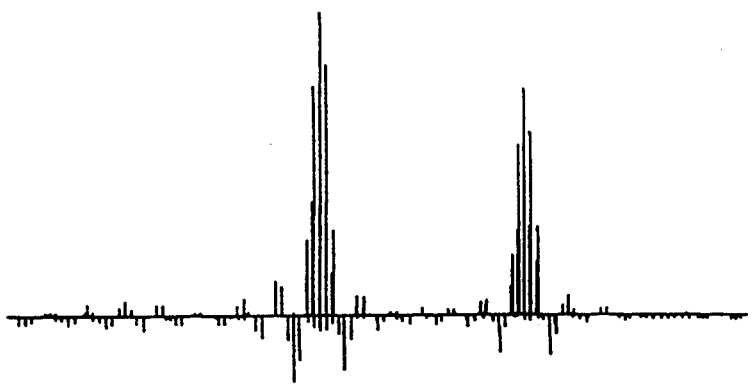
FIG. 6 shows a diagram of the direct and stimulated echo signals obtained by means of the pulse sequence illustrated in FIGS. 3a through 3d.
Figure 8A:
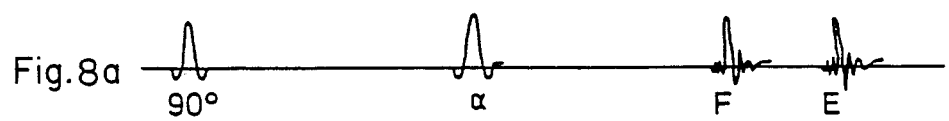
FIGS. 8a through 8d depict the diagram of the pulse sequence used by a third embodiment of the method according to the invention.
Figure 8B:
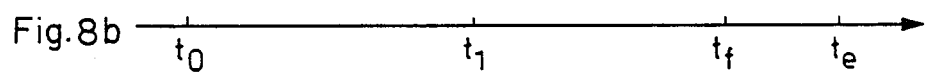
Figure 8C:
Figure 8D:
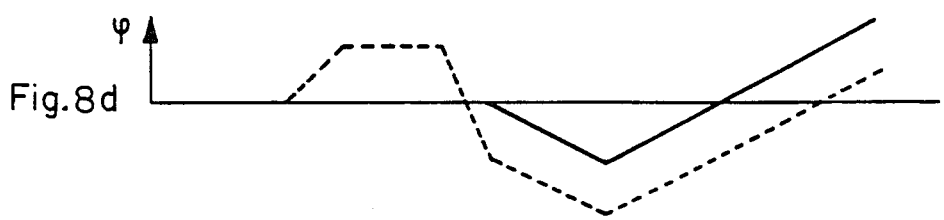

If several such refocussing pulses are applied during one pulse sequence, the effect of the pulse on each of these states must be taken into account. The experiment illustrated in FIG. 3 using the incompletely compensated phase gradient according to FIG. 3d, therefore, leads to the evolution diagram illustrated in FIG. 5. This diagram illustrates the repeated splitting-up of the transverse magnetization into four sub-states, at each of the successive α pulses, and the phase shift resulting from the residual amount ΔP of the incompletely compensated phase gradient. The additional gradient ΔP so formed leads to the formation of additional states with the result that the echoes are doubled following the second α pulse. These echoes result from the intersections E1 and E2 with the time axis T. As a result thereof, one obtains a doubled echo train of the type which is represented in FIG. 6 and whose envelope shows a double echo. The quantitative evaluation of the diagram of FIG. 5 shows that the result of the experiment consists in the superposition of an echo train which is encoded by the phase gradient before the echo, and an echo train which is encoded by the negative phase gradient after the echo.

Given the fact that additional flow-responsive dephasing of the NMR signal occurs under the effect of gradients, the phase of the two superposed echo trains is phase-modulated, and the interferogram lines are displaced correspondingly. As the amount of such displacement is determined decisively by the relative phase difference between the echoes of equal phase encoding and as these echoes are recorded in interferometry experiments at time intervals of one to several seconds, it follows that this embodiment of the method according to the invention is extremely sensitive to flowing material. The flow parabolas illustrated in FIG. 10 correspond to a velocity of only approximate 3 mm/s. Accordingly, the method is excellently suited for measuring extremely small flow effects in pure liquids having T2 relaxation times in the seconds range. Considering that this embodiment of the method according to the invention makes use of double phase encoding, it will be described hereafter as DOPE method, and the measuring sequence used will be described as DOPE sequence.

The generation of a double signal according to the invention can be achieved also by superposing a direct echo and a stimulated echo. The sequence required for this purpose is represented in FIG. 7. Line (a) shows, above the time axis represented in line (b), a sequence of three rf pulses with flip angles of 90°, α and β. For the pulse sequence of FIG. 7, the flip angles of the α and β pulses are preferably in the range of from about 90° to about 135°. Any variation of α and β leads to a variation of the relative signal intensity of the stimulated and the direct echo. The flip angles of the α and β pulses are chosen to provide stimulated and direct echoes of desired amplitudes. In obtaining stimulated and direct echoes of desired amplitudes, a tradeoff must generally be made between the quality of the resulting magnetic resonance image and the effectiveness by which the measured parameter is represented by a striated pattern on the image. Line (c) shows the operative times of the read gradient which is applied as usual in imaging experiments Finally, line (d) represents a schematic phase diagram for illustrating the formation of the echo. The full line corresponds to the signal which is dephased between the first and the second rf pulse, i.e. the 90° pulse and the α pulse, then inverted by the α pulse, rephased between the α pulse and the β pulse, then furnishes the echo signal b1 and is finally dephased again. Thereafter, this signal is re-inverted by the third pulse and then rephased once more to form an echo E1. Before the α pulse and after the β pulse, the magnetization content leading to the stimulated echo develops in the same manner as the content furnishing the echo E1. Between the α pulse and the β pulse, however, the magnetization is a coherent z magnetization so that no further phase evolution is encountered. If the phase evolution of the signal leading to the direct echo is such that the phase of this content is not identical, after the β pulse, to the phase of this content before the α pulse, then the stimulated echo E2 is formed at a point in time different from the direct echo E1, and accordingly a double echo is obtained. Given the fact that the coherent z magnetization between α pulse and the β pulse remains unaffected by a gradient, the time interval between the α pulse and the β pulse may be used for encoding the parameter to be measured by the NMR interferometry method according to the invention. Ordinarily, the longer the time interval between the α pulse and the β pulse, the more sensitive the experiment. Preferably, the time interval between the α pulse and the β pulse is in the range of from about 30 msec to about 1 sec.

Here again, flow measurements may serve as a particularly explanatory example. It is generally known that the signal of flowing substances is dephased under the effect of a gradient in a manner different from a signal originating from a stationary substance. Consequently, the stimulated echo in an image-generating sequence is subjected to more or less strong dephasing which may even be intensified by symmetrical application of additional gradients before the α pulse and after the β pulse. Additional gradients applied between the α pulse and the β pulse may be used for suppressing any flow-dependent phase of the signal of the direct echo. For thus purpose, the following conditions must be fulfilled for the gradients in all the three spatial directions:

$$\int_{t_0}^{t_e} G(t) \cdot x(t) \, (dt) = 0$$

wherein $t_e$ is the triggering time of the signal and $x(t)$ is the time-dependent coordinate of the spin package being observed. As a result, a phase difference is obtained between the stimulated and the direct echo which manifests itself in the NMR interferogram as displacement of the striated pattern.

As an example for measurements of other parameters, the determination of the local field strength will now be described. If the gradient fields are applied in such a manner that the stimulated echo E2 appears at a time $t_s$ which is spaced from the time $t_2$ at which the β pulse appears by an amount equal to the spacing $t_1 - t_0$ between the α pulse and the 90° pulse, then the signal does not contain any information on time-constant additional fields B of the type encountered in any NMR experiment due to field inhomogeneities, susceptibility variations or non-uniform chemical displacement. In contrast, the direct echo carries a dephasing P which is determined by the formula $$P = 2\pi\gamma B \left[ (t_d - t_3) - (t_2 - t_1) + (t_1 - t_0) \right].$$

Accordingly, the sensitivity to B of this experiment can be determined by suitable selection of the time parameters and displayed in an NMR interferogram. It is possible in this manner to display susceptibility variations, field inhomogeneities and substances of different chemical composition by means of the method according to the invention.

Finally, another variant of the method according to the invention will be described where the signal is generated by superposition of the free induction decay with an echo. The corresponding pulse sequence is represented in FIG. 8. Of the two signals used for generating the interferogram one is the echo of two rf pulses having the flip angles of approximately 90° and $\alpha$, respectively, while the other one represents the free induction decay from the approximately 90° pulse alone. The flip angle $\alpha$ for the $\alpha$ pulse of the method represented in FIG. 8 is preferably the range of from about 90° to about 150°. The amount of the 90° and $\alpha$ flip angles turn determines the intensity of the two signals. The phase evolution of the two signals is represented in line (d) of FIG. 8, while line (a) represents the rf pulses and the echo signals over the time axis (b), and line (c) indicates the operative time and polarity of the read gradient. The intensity and duration of the read gradient are preferably determined in accordance with an NMR imaging procedure. The full line in line (d) of the phase diagram illustrates the generation of a signal F by the free induction decay, while the broken line illustrates the generation of the direct echo E. The time between the 90° pulse and the $\alpha$ pulse may be used as evolution time $t_k$ for parameter encoding for NMR inferometry. The evolution time $t_k$ is generally a factor influencing the sensitivity of the method. In general, the longer the evolution time $t_k$, the more sensitive the method, but the smaller the signal due to spin relaxation effects. This variant permits again to represent flowing material and to measure local magnetic fields.

For measuring flowing material, the flow-dependent dephasing of the direct echo E on the one hand and the signal F resulting from the free induction decay on the other hand must be different. Here again, the flow-dependent dephasing of the free induction decay may be compensated to zero by suitable additional gradients, while flow-dependent dephasing is maintained for the output echo E.

For measuring local magnetic fields it may again be ensured that the condition $T_e - T_1 = t_1 - t_0$ is fulfilled, i.e. that the echo signal E is spaced from the $\alpha$ pulse by a time interval substantially equal to the time interval between the $\alpha$ pulse and the 90° pulse. In this case, the direct echo does not contain any information regarding time-constant additional fields. In contract, the signal F resulting from the free induction decay is dephased by an amount equal to $$P = 2\pi\gamma B(t_f - t_1).$$

This dephasing is represented by the NMR interferogram in the manner described above. Conversely, it is also possible, by increasing the spacing between the $\alpha$ pulse and the 90° pulse, to achieve a dephasing of the echo signal which is much greater than the dephasing of the free induction decay, whereby the sensitivity of the experiment can be increased.

As noted above, FIGS. 9 and 10 illustrate respectively two-dimensional NMR tomographic images of still and flowing water obtained in accordance with a preferred method of the present invention. The images were obtained by proton magnetic resonance at a proton magnetic resonance frequency of about 10 MHz. The NMR images were generated using the RARE procedure essentially as described in an article by Hennig et al. in the *Journal of Computer-Assisted Tomography*, volume 10, pages 375–378 (1986) in conjunction with the preferred method of the invention of illustrated in FIG. 3 discussed above. The approximately 90° pulse of the method of FIG. 3 was about 3.5 msec in width. The $\alpha$ pulses had flip angles of about 150° and were about 2.5 msec in width. The phase of each $\alpha$ pulse was shifted approximately 90° from the phase of the initial 90° pulse. The time interval between the initial 90° pulse and the first $\alpha$ pulse was approximately 17 msec. The time interval between adjacent $\alpha$ pulses was approximately 34 msec. The magnetic field gradients were roughly 3 mT/m in intensity. In the case of FIG. 9, an NMR image was obtained in accordance with the invention from a sample of still water contained in a vessel of approximately square cross section. In the case of FIG. 10, an image pursuant to the invention was obtained of water caused to flow through a hollow tube at a flow velocity of approximately 3 mm/s. The method of the invention permits the flowing water to be readily distinguished from still water, as may be seen by comparing FIGS. 9 and 10.

The above explanations show that the method according to the invention offers the person of the art a tool which makes it possible to determine the value of an additional parameter in multi-dimensional NMR spectroscopy and, in particular, in NMR image generation, with high precision, and without any additional apparatus input. The measuring processes themselves are neither rendered more complex, nor extended in time. Quite to the contrary, the methods used heretofore in NMR spectroscopy can be modified in a straightforward manner so that double signals are obtained which exhibit the phase decoding depending on the parameter to be measured and which can then be used without any difficulty for deriving a striated pattern representative of the local value of the parameter. Given the possibility to modify the known experiments with a view to generating double signals and, thus, with a view to producing the NMR interferograms according to the invention, it is also readily obvious that the invention is by no means limited to the described embodiments, but that many possibilities are available to the person of the art for making use of the method operating according to the principles disclosed by the invention.

I claim:

1. Method for encoding and displaying n parameters in multi-dimensional Fourier NMR spectroscopy, wherein n represents an integer $\geq 2$, wherein two data sets are generated simultaneously which are encoded in the same manner relative to (n−1) parameters, but shifted in phase relative to in the direction of evolution of the nth parameter, which data sets furnish first and second signals following each other in pairs, the relative phase position of the said signals being determined by the value of the nth parameter, and the former of the said signals corresponding to the one, the latter to the other of the two data sets, and wherein a signal characteristic of the value of the nth parameter is obtained by Fourier transformation of the signals corresponding to the two data sets, characterized in that the first and second signals belonging to one pair are treated as one signal for the purposes of Fourier transformation so that a (n−1)-dimensional spectrum is obtained with a superposed striated pattern characteristic of the value of the nth parameter.

2. Method according to claim 1, characterized in that for recording the (n−1) data sets pulse sequences are used which furnish a direct and a stimulated echo as first and second signals.

3. Method according to claim 2, characterized in that the pulse sequence comprises a number of successive refocussing pulses and that at least one of the parameters is encoded by a field gradient to which a compensation gradient is assigned after each echo signal, and that the nth parameter is encoded by generation of a compensation gradient differing from the field gradient.

4. Method according to claim 2, characterized in that encoding of the nth parameter is effected during the time interval between the first and the second refocussing pulse, when the magnetization of the content generating the stimulated signal is present as coherent z magnetization.

5. Method according to claim 1, characterized in that the flip angle of the first refocussing pulse differs from the flip angle of the following refocussing pulses.

6. Method according to claim 5, characterized in that the pulse sequence comprises a number of successive refocussing pulses and that at least one of the parameters is encoded by a field gradient to which a compensation gradient is assigned after each echo signal, and that the nth parameter is encoded by generation of a compensation gradient differing from the field gradient.

7. Method according to claim 5, characterized in that encoding of the nth parameter is effected during the time interval between the first and the second refocussing pulse, when the magnetization of the content generating the stimulated signal is present as coherent z magnetization.

8. Method according to claim 7, characterized in that encoding of the nth parameter is effected by application of a corresponding gradient within the beforementioned time interval.

9. Method according to claim 1, characterized in that for recording the (n−1) data sets pulse sequences are used which furnish the free induction decay and an echo signal as first and second signals, respectively, and that encoding of the nth parameter is effected during the time interval preceding the refocussing pulse effecting the generation of the echo signal.

10. Method according to claim 5, characterized in that encoding of the nth parameter is effected by application of a corresponding gradient within the beforementioned time interval.

11. Method according to claim 1, characterized in that the (n−1) parameters are characteristic of two directions in image plane and that the data sets are processed according to the 2DFT method to obtain an image with a superposed striated pattern representative of a third parameter.

12. Method according to claim 1, characterized in that the nth parameter is the flow velocity of the material under examination.

13. Method according to claim 1, characterized in that the nth parameter is the variation of the local susceptibility of the material under examination.

14. Method according to claim 1, characterized in that the nth parameter is the variation of the strength of the local magnetic field in the area of the material under examination.

15. Method according to claim 1, characterized in that the nth parameter is the variation of the chemical displacement in the area of the material under examination.

* * * * *